United States Patent [19]

Kerbaugh et al.

[11] Patent Number: 4,799,990

[45] Date of Patent: Jan. 24, 1989

[54] METHOD OF SELF-ALIGNING A TRENCH ISOLATION STRUCTURE TO AN IMPLANTED WELL REGION

[75] Inventors: Michael L. Kerbaugh, Burlington; Charles W. Koburger, III, Essex; Jerome B. Lasky, Essex Junction; Paul C. Parries, Essex Junction; Francis R. White, Essex Junction, all of Vt.

[73] Assignee: IBM Corporation, Armonk, N.Y.

[21] Appl. No.: 44,374

[22] Filed: Apr. 30, 1987

[51] Int. Cl.⁴ .................. H01L 21/265; H01L 21/308
[52] U.S. Cl. ..................................... 156/636; 156/643; 156/648; 437/20; 437/67; 437/228; 437/984
[58] Field of Search .............. 156/643, 648, 649, 645, 156/636; 437/20, 62, 67, 228, 249, 924, 984

[56] References Cited

U.S. PATENT DOCUMENTS

| | | | |
|---|---|---|---|
| 4,333,794 | 6/1982 | Beyer et al. | 156/648 |
| 4,366,613 | 1/1983 | Ogura et al. | 29/571 |
| 4,463,493 | 8/1984 | Momose | 437/67 X |
| 4,465,532 | 8/1984 | Fukano | 437/67 X |
| 4,478,655 | 10/1984 | Nagakubo et al. | 156/648 X |
| 4,502,914 | 3/1985 | Trumpp et al. | 156/643 |
| 4,551,911 | 11/1985 | Sasaki et al. | 156/648 X |
| 4,650,544 | 3/1987 | Erb et al. | 156/653 |

OTHER PUBLICATIONS

R. D. Rung; "Trench Isolation Prospects for Application in CMOS VLSI", *International Electron Devices Meeting Technical Digest*, Dec. 1984, pp. 574–577.

*Primary Examiner*—Kenneth M. Schor
*Assistant Examiner*—Andrew J. Anderson
*Attorney, Agent, or Firm*—Sughrue, Mion, Zinn, Macpeak & Seas

[57] ABSTRACT

A method for self-aligning an isolation structure to a diffusion region. A first masking layer is formed on a semiconductor substrate, the first masking layer having at least one aperture sidewall which is substantially perpendicular to the semiconductor substrate. Dopant ions are implanted into the semiconductor substrate through the first masking layer to form a doped region. Sidewall spacers are then defined on the sidewalls of the aperture, and a sidewall image reversal process is carried out such that the sidewall spacers define trench apertures in a masking structure. Finally, isolation trenches are etched into the semiconductor substrate through the masking structure. Alternatively, the implantation step is carried out after the sidewall spacers are defined on the first masking layer.

11 Claims, 4 Drawing Sheets

METHOD OF SELF-ALIGNING A TRENCH ISOLATION STRUCTURE TO AN IMPLANTED WELL REGION

CROSS-REFERENCE TO RELATED APPLICATIONS

Reference is made to co-pending U.S. patent application Ser. No. 791,860, entitled "Chem-Mech Polishing Method for Producing Coplanar Metal/Insulator Films On A Substrate," filed Oct. 28, 1985 by Beyer et al, and assigned to the assignee of the present application. This application is directed to forming apertures in an insulator layer, overfilling these apertures with metal, and polishing the metal back so that portions above the surface of the insulator layer are removed.

Reference is made to co-pending U.S. patent application Ser. No. 791,861, entitled "Method For Removing Protuberances At The Surfaces Of A Semiconductor Wafer Using A Chem-Mech Polishing Technique," filed Oct. 28, 1985 by Beyer et al, now U.S. Pat. No. 4,671,851 issued June 9, 1987 and assigned to the assignee of the present application. This application is directed to planarizing oxide protuberances by using a silicon nitride layer as an etch-stop.

Reference is made to co-pending U.S. patent application Ser. No. 791,887, entitled Method For Producing Coplanar Multi-Level Metal/Insulator Films On A Substrate And For Forming Patterned Conductive Lines Simultaneously With Stud Vias," filed Oct. 28, 1985 by Chow et al, and assigned to the assignee of the present application. This application is directed to patterning a glass layer so that it simultaneously defines a wiring plane and an interconnection stud, filling the patterned glass with metal so as to form the structures, and polishing portions of the metal above the surface of the glass layer so that the metal is coplanar with the glass.

BACKGROUND OF THE INVENTION

1. Technical Field

The present invention relates to a method of self-aligning a trench isolation structure to an implanted well region.

2. Background Art

The trend of the semiconductor industry is toward smaller more densely packed Very Large Scale Integrated Circuits (VLSIC). As devices become smaller and more densely packed, device interreactions become more of a common occurrence and concern. Many different approaches have been proposed for providing electrical isolation between neighboring semiconductor devices.

The isolation approach to which the present invention is directed is the use of isolation trench structures which are aligned to the perimeter of an implanted well region. In FIG. 1, there is shown a cross sectional view of an implanted semiconductor device provided with isolation trench structures.

More particularly, there is shown a doped or implanted well region 110 formed in a semiconductor substrate body 100. For the purpose of this application, the implanted well region 110 is a generic representation which represents a region utilized in any of numerous semiconductor devices, for example, a bipolar transistor, an FET transistor or a diode. Formed at the periphery of the implanted well region 110 are isolation trenches 120 and 130 which are filled with an insulator material 140. Each of the isolation trenches 120 or 130, filled with the insulator material 140, represents an isolation trench structure or barrier which isolates the implanted well region from neighboring implanted well regions or devices. Any of the insulator materials well known in the semiconductor art can be used, one suitable example being silicon dioxide.

It should be noted that FIG. 1 represents an ideal arrangement; i.e., where the isolation trench structures are perfectly aligned to the perimeter of the implanted well region, and where the whole of the semiconductor substrate area between these isolation structures is efficiently doped at an optimum doping concentration.

Turning now to FIGS. 2A–2C, there is shown a prior art approach directed toward fabricating the above trench isolation arrangement. In this prior art approach, two maskings steps are utilized to fabricate the resulting structure. In the first processing step of FIG. 2A, a first resist layer 210 is formed on the top surface of a semiconductor substrate body 200. The first resist layer 210 has been patterned in accordance with a first mask to provide an aperture 220 which is used to facilitate doping of the implanted well region 230 into the semiconductor substrate body 200.

Once implanted, the first resist layer 210 is removed, and a second resist layer is formed on the top surface of the semiconductor substrate body 200. This second resist layer 240, as shown in FIG. 2B, is then patterned in accordance with a second mask to provide the trench apertures 250 and 260 which are used to etch isolation trenches 270 and 280 into the semiconductor substrate body 200. Once formed, the second resist 240 is removed, and the isolation trenches 270 and 280 are filled with an insulator material 290. The result of these processing steps is an implanted well region 230 with corresponding isolation trench structures as shown in FIG. 2C.

In addition to showing the processing steps, FIGS. 2A–2C also illustrate shortcomings of this prior art approach. The first of these shortcomings results from the use of a two-mask approach. As can be seen in FIGS. 2B and 2C, any misalignment of the first and second mask will result in misalignment of the isolation trench structures with the corresponding implanted well region. This misalignment is disadvantageous in at least two respects. First, a portion of the implanted well region 230 is caused to lie or stray outside the isolation region. This stray implantation may very well interfere with neighboring devices. Second, a portion of the isolation region is at a less than optimum doping concentration, thereby producing an inefficient use of semiconductor substrate area. As a another shortcoming, there is a further inefficient use of semiconductor substrate area due to large widths of the isolation structures. This large width is caused by the limitations associated with using a photolithography masking technique to define the trench apertures.

As a result of the deficiencies in the prior art, there has long existed a need for a processing approach which offers greater guarantees that an isolation trench structure will be self-aligned to the implanted well region, that no stray implantation regions will be formed outside of the isolation region, and that the semiconductor substrate area between the isolation structures will be doped to an optimum doping concentration. Furthermore, there has long existed a need for a processing approach which produces narrow isolation trench structures.

SUMMARY OF THE INVENTION

Thus, an object of the invention is to provide an improved processing approach which self-aligns a trench isolation structure to an implanted well region.

An additional object of the present invention is to provide a trench isolation approach whereby the width of the isolation trenches is minimized.

Still another object is to provide a trench isolation processing approach having a minimum of processing steps.

These and other objects of the invention are realized in an isolation trench structure processing approach using one mask and a Sidewall Image Reversal (SIR) process. In a preferred embodiment, a resist layer is patterned to provide an aperture to the semiconductor substrate body. A first conformal layer is then deposited and an anisotropically etched to provide a sidewall spacer along the perimeter of the aperture. The smaller aperture defined between the sidewall spacers is then used as a window to implant a well region into the semiconductor substrate body. A second conformal layer is then applied and anisotropically etched to provide second sidewall spacers along the perimeter of the smaller aperture. The resist layer is then removed, and an oxide layer is deposited to cover the sidewall spacers. A polishing process is applied to slowly remove the oxide layer to a point where the tops of the sidewall spacers are exposed. The sidewall spacers are then removed, and the resulting apertures are used to etch isolation trenches which are self-aligned to the implanted well region. The isolation trenches are filled with an insulator material to produce isolation trench structures that are self-aligned to the implanted well region.

BRIEF DESCRIPTION OF THE DRAWINGS

The foregoing and other approaches and teachings of the present invention will become more apparent from the following detailed description of the preferred embodiment for carrying out the invention. In the description, reference will be made to the accompanying drawing in which.

DESCRIPTION OF THE PREFERRED EMBODIMENT

Turning now to FIGS. 3A-3F, there is shown a first processing approach of the present invention. In these figures and in the figures to follow, it should be understood that the illustrated height, width and thickness dimensions are for the sake of example and clarity only, and are not intended to designate relative or actual dimensions; i.e., some dimensions may be exaggerated to improve the clarity of the illustrations. Examples of typical dimensions which are known will be revealed in the following description.

Figure 1:
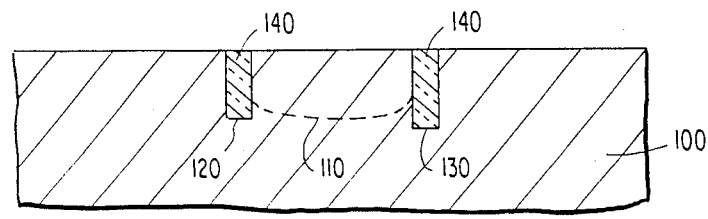
FIG. 1 is a cross-sectional view of an ideal isolation structure arrangement.
Figure 2A:
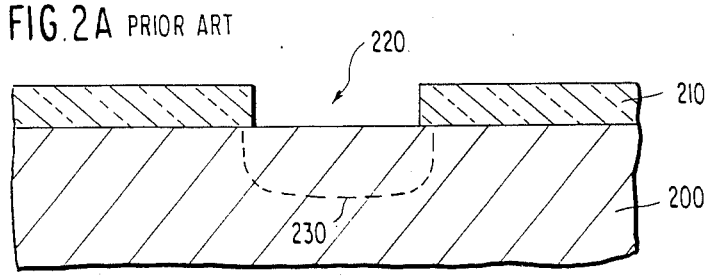
FIGS. 2A-2C are cross-sectional views of a prior art processing approach used to provide the trench isolation structure arrangement of FIG. 1.
Figure 2B:
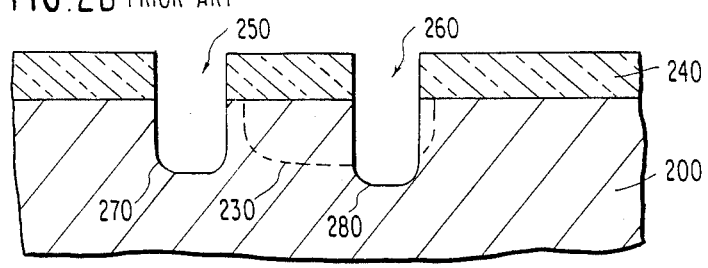
Figure 2C:
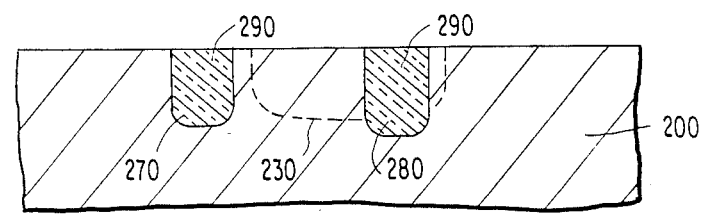
Figure 3A:
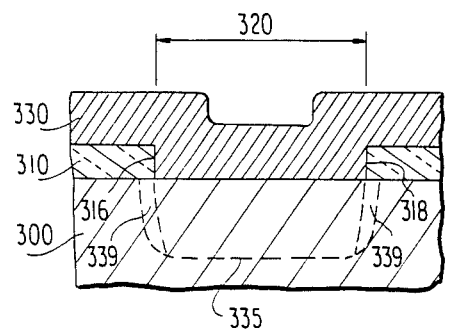
FIGS. 3A-3F are cross-sectional views of one processing approach of the present invention.

In the first processing step of FIG. 3A, a resist layer 310 is formed on top of a semiconductor substrate body 300. The resist layer 310, which can be composed of any well known photosensitive polymer (e.g. novolac resin), is patterned to provide a well aperture 320. Alternatively, a masking layer such as polyimide can be utilized as layer 310, in which case the aperture would be defined by a subsequently-applied photo resist layer. One aspect which will be shown to be important, is that a suitable resist layer and etching process should be used such that the aperture is formed with substantially vertical sidewalls. The well aperture 320 is then utilized to implant doping materials into the semiconductor substrate body 300 to define a well region (e.g. an N-type well region in a P-type substrate). While the implanted region is described as being a well region, in practice the implant could be utilized to form any diffusion region requiring isolation.

Once fabricated, the diffusion region must be provided with trench isolation structures. In this regard, the present invention does not utilize the two mask approach of the prior art. Instead, the present invention utilizes sidewall spacers on the original resist layer and aperture to provide alignment of the various semiconductor structures. One example of using sidewall spacers is found in U.S. Pat. No. 4,366,613, assigned to the assignee of this application and issued to Ogura et al, and which discloses the construction of MOS Dynamic RAMs with a lightly doped drain. In addition to utilizing sidewall spacers, the present invention adds the further refinement of using an SIR approach to fabricate very narrow isolation trenches. Such trenches are desirable because the majority of semiconductor substrate area can now be devoted to the construction of semiconductor devices. A reference, which discusses an evaluation of trench isolation in CMOS devices is R.D. Rung, "Trench Isolation Prospects for Application in CMOS VLSI," 1984 *IEDM Technical Digest* pp. 574-577.

As it is needed for a full understanding of the present invention, a brief description of both the sidewall spacers and the SIR process will now be presented. In conventional photolithograpic masking approaches, a mask is placed over the semiconductor structure, and then light is used to focus the mask image onto the surface of a resist layer. Due to focusing and light wavelength constraints, there is a limitation on how small an image can be formed. By using sidewall spacers (i.e. a layer of material formed on a vertical sidewall structure or mandrel) to define a masking image, images can be formed having sub-photolithographic dimensions. Moreover, since a very thin layer can be formed on a vertical sidewall structure, and since the thickness of this layer can be highly controlled, the sidewall spacer approach offers a high degree of control over image size.

In the first step in the sidewall spacer process, once the implanted well region 335 has been formed, a conformal layer 330 is formed over the entire surface of the semiconductor structure. Layer 330 should be "conformal" in the sense that the material is deposited with equal thickness on all exposed surfaces, and especially on the resist layer sidewalls 316 and 318. Any of the well known conformal deposition methods and materials can be used, for example, in a preferred embodiment, a nitride material is deposited by chemical vapor deposition (CVD).

A critical point in the sidewall spacer approach is that the resist layer sidewalls 316 and 318 outlining the aperture 320 are used as vertical mandrels upon which a portion of the conformal layer is formed. Since "vertical" is a relative direction depending on the position which the semiconductor is held, the sidewalls or mandrels 316 and 318 are more accurately described as being perpendicular to the semiconductor substrate surface. The portions of the conformal layer 330 on the sidewalls 316 and 318 correspond to the mask which will be used to define the isolation trenches. Since the width of the isolation trenches to be formed will correspond exactly to the thickness of the conformal layer 330, this layer should be deposited to the thickness of the desired width of the isolation trenches. As one example, a nitride layer of 0.2 microns is suitable.

Figure 3B:
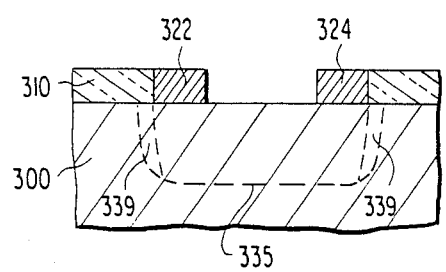

Once the conformal layer 330 has been deposited, an anisotropic etch is performed. The etch is "anisotropic" in the sense that the etch has a directional preference in attacking the horizontal portions of the conformal layer 330 while leaving vertical portions thereof undisturbed. The result of the anisotropic etching operation is shown in FIG. 3B. Note that the horizontal portions of the conformal layer 330, which were originally deposited on top of the resist layer 310 and within the well aperture 320, have been removed. Remaining are the sidewall spacers 322 and 324.

Once the sidewall spacers 322 and 324 have been formed, the sidewall image reversal process is then carried out. By "sidewall image reversal" we mean a process by which apertures are formed (in a masking structure) where the sidewall spacers are presently disposed. Because the sidewall spacers are narrow, the resulting openings in the masking structure will also be narrow. As existing SIR approach for defining trench apertures by performing a sidewall image reversal process can be found in U.S. Pat. No. 4,502,914, assigned to the assignee of this application, and issued to Trump et al, the teachings of which are herein incorporated by reference. During experimentation, it was determined that the planarizing etch method taught by Trump is not optimal for use with the present invention because of poor etch selectivity. Thus the SIR processing steps of Trump et al have been modified as described below with reference to the illustrations of Figs. 3C-3D.

Figure 3C:
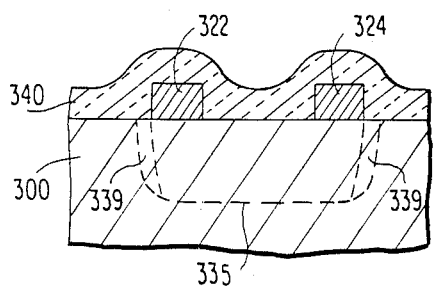
Figure 3D:
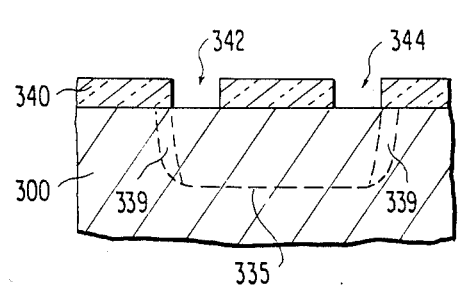

After resist removal, layer 340 is deposited on top of the semiconductor substrate body, as shown in FIG. 3C, so as to cover the vertical image portions 322 and 324. A planarization etch (preferably a polishing process) is then applied to the layer 340, to a point where the tops of the sidewall image portions 322 and 324 are polished or clipped off. This polishing step should be carried out in the presence of an abrasive slurry (e.g. Cab-O-Sil plus KOH), with a polishing pad pressure of approximately 14 PSI. Once the tops of the sidewall spacers 322 and 324 have been exposed, an etchant is employed which preferentially attacks the sidewall spacers without attacking the other surfaces. In the preferred embodiment wherein the sidewall spacers are made up of nitride, layer 340 is made up of silicon oxide. Hot $H_3PO_4$ will attack the nitride spacers without substantially attacking the surrounding oxide. The result, shown in FIG. 3D, is an isolation trench mask structure having trench apertures 342 and 344 in perfect alignment with the implanted well region 335.

Figure 3E:
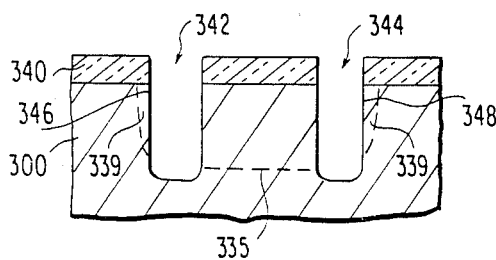

As shown in FIG. 3E, the trench apertures 342 and 344 are then used to etch the isolation trenches 346 and 348 into the semiconductor substrate body 300. This etching process can be performed by well known semiconductor etch methods, and in a preferred embodiment is carried out in a chlorine-based reactive ion etch (RIE). The remaining oxide layer 340 is then removed.

Figure 3F:
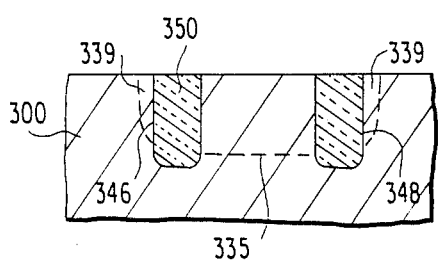

Although the air-filled isolation trenches may be a suitable isolation structure in some applications, in a preferred embodiment the isolation trenches 346 and 348 are filled with an insulator material 350, thereby resulting in the isolation arrangement shown in FIG. 3F. Since the same aperture was used for both the diffusion process and the SIR process, the isolation trench structures are self-aligned to the ends of the implanted well region 335.

Although the above processing steps result in self-alignment, such a processing approach may produce a shortcoming due to the lateral scattering of implanted ions. That is, as shown in FIG. 3A, during implantation, ions will scatter laterally with respect to the portion of the substrate exposed by resist opening 320, forming lateral diffusion regions 339 having low dopant concentrations. In FIG. 3F, note that these lateral portions 339 lie outside the isolated well region. Because the trench apertures 342 and 344 defined along the periphery of the well aperture 320 are used to vertically etch the isolation trenches 346 and 348 into the semiconductor substrate body, the portions 339 lying beyond the well aperture 320 were not removed. This result is disadvantageous in that the laterally scattered dopant outside the isolated region may interfere with neighboring devices.

FIGS. 4A-4F illustrate an alternative processing approach which avoids this lateral scattering problem. In FIGS. 4A-4F, structural elements which are the same as those of the first embodiment are designated by the same reference numerals or characters, and detailed descriptions thereof are omitted.

Figure 4A:
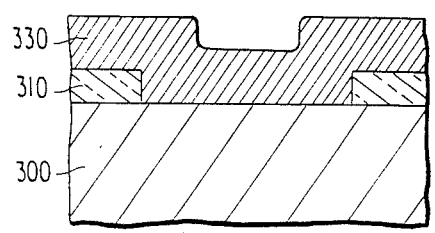
FIGS. 4A-4F are cross-sectional views of another processing approach of the present invention.
Figure 4B:
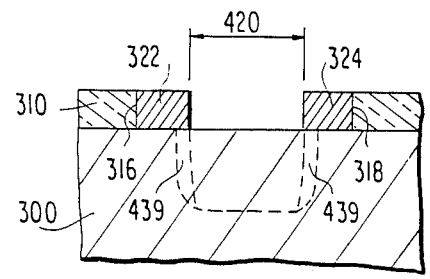
Figure 4C:
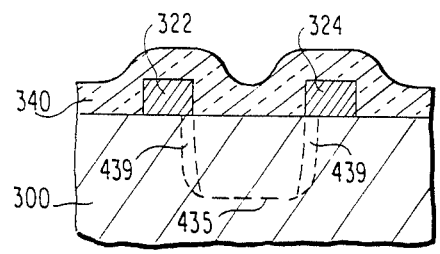
Figure 4D:
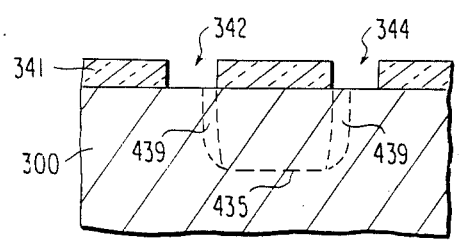
Figure 4E:
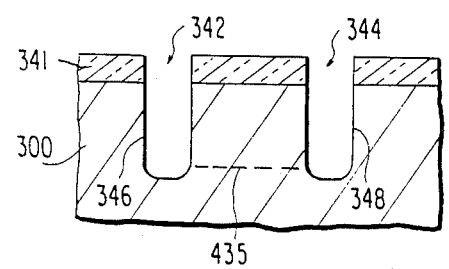
Figure 4F:
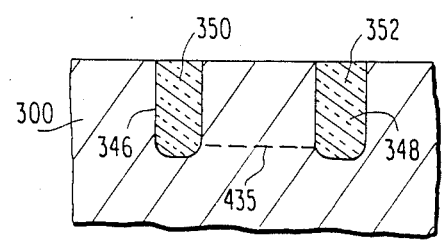

In the alternative processing approach of FIGS. 4A-4F, the process for forming the implanted well region is delayed until after the conformal layer 330 as been anisotropically etched to define the sidewall spacers 322 and 324. As shown in FIG. 4B, the space 420 between the sidewall spacers 322 and 324 is used to define a narrow implanted well region 435. Like region 335 of FIGS. 3A-3F, the implanted well region 435 has a peripheral region of lowered concentration 439 formed solely by laterally scattered dopants. However, note that these lateral diffusion areas 439 are disposed beneath the sidewall spacers 322 and 324, in contrast to being disposed under the resist layer 310 as shown in FIG. 3A. The remaining sidewall image reversal, trench etch and trench fill processing steps of FIGS. 4C-4F exactly match those for FIGS. 3C-3F, and the resulting isolated well device arrangement is shown in FIG. 4F.

Like the first processing approach of FIGS. 3A-3F, the processing approach of FIGS. 4A-4F provides excellent alignment of the isolation structures with the implanted well region. As an additional advantage, the processing approach of FIGS. 4A-4F avoids the lateral scattering problem by allowing the lateral scattering to occur under the sidewall spacers 322 and 324. Since the sidewall image spacers 322 and 324 are used to define the trench apertures 342 and 344, the laterally scattered dopants are subsequently removed during the etching of the isolation trenches 346 and 348. Thus, as shown in FIG. 4F, the implanted well region 435 lies entirely within the region defined by the isolation trench structures.

Although the processing approach of Figs. 4A-4F provides excellent alignment and avoids one lateral scattering problem, a new shortcoming may be introduced. In the resulting isolated well device shown in FIG. 4F, the portions of the implanted well region 435 adjacent to isolation regions 350 and 352 may be at a less than optimum doping concentration. The reduced concentration result from depletion of dopant atoms scattered into regions 439. This and the previous shortcomings are overcome by the preferred processing embodiment which will now be described with reference to FIGS. 5A-5H.

In FIGS. 5A-5H, structural elements which are the same as those in the first embodiment are designated by the same reference numerals or characters, and detailed descriptions thereof are omitted.

Figure 5A:
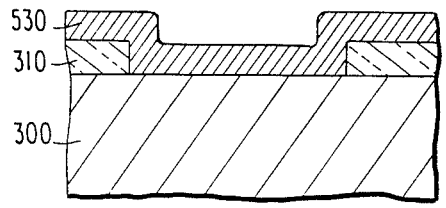
FIGS. 5A-5H are cross sectional views of the preferred processing approach of the present invention.

In the first processing step of FIG. 5A, the resist layer 310 is formed on top of the semiconductor substrate body 300 in the same manner as shown in FIGS. 3A and 4A. Once the resist layer 310 has been patterned to provide an aperture, a first conformal layer 530 is formed. The first conformal layer 530 is deposited in a similar manner, and is of a similar material, as that of the conformal layers of FIGS. 3A and 4A except that it is deposited to a lesser thickness. In a preferred embodiment, the thickness of the first conformal layer is one-half the thickness of the desired isolation trench structures.

Figure 5B:
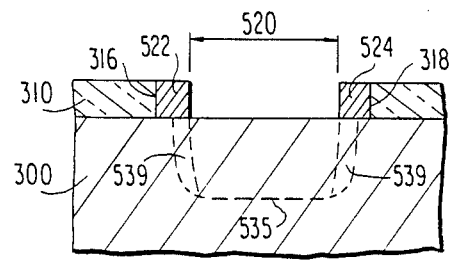

An anisotropic etch is then performed in the same manner, as shown in FIGS. 3A and 4A to remove the horizontal portions of the first conformal layer 530. The result is that first sidewall spacers 522 and 524 are defined, as shown in FIG. 5B. The area 520 between the first sidewall spacers 522 and 524 is then used as a aperture through which to implant well region 535.

As in the previously desribed embodiments, implant scattering results in the formation of lateral diffusion regions 539. Similarly to the process step shown in FIG. 4b, the lateral diffusion regions 539 are disposed under the existing first sidewall image portions 522 and 524.

Figure 5C:
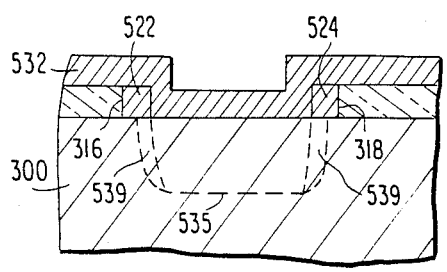
Figure 5D:
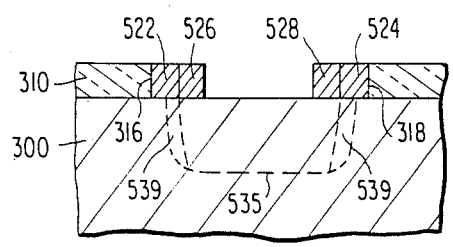
Figure 5E:
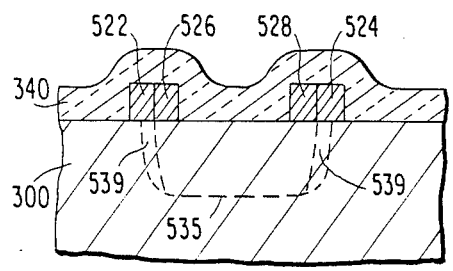
Figure 5F:
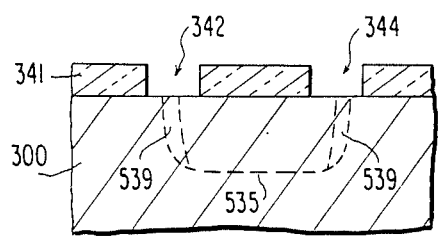
Figure 5G:
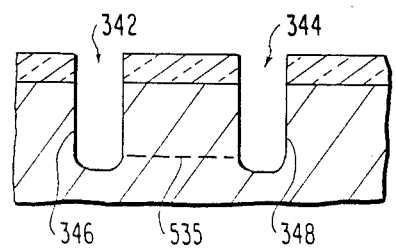

Once the implanted well region 535 has been formed, a second conformal layer 532 is then formed over the entire semiconductor structure as shown in FIG. 5C. Like the first conformal layer 530, the second conformal layer 532 is formed in a similar manner, and is of a similar material, as that shown in FIGS. 3A and 4A, except that it is deposited to a reduced thickness. In a preferred embodiment, the second conformal layer 532 is deposited to one-half the width of the desired isolation trench structures. A second anisotropic etch is then conducted to remove the horizontal portions of the second conformal layer 532. The result, as shown is FIG. 5D, is that second sidewall spacers 526 and 528 are left adjacent to the first sidewall image portions 522 and 524, respectively.

Figure 5H:
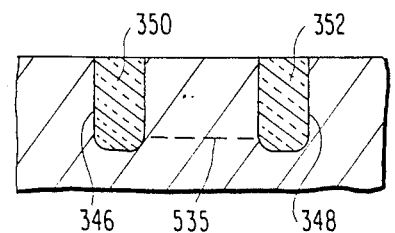

The combined width of each of the neighboring first and second sidewall spacers 522, 524, and 526, 528 is equivalent to the width of the desired isolation trench structures. That is, each of the sidewall spacer pairs 522, 526 and 524, 528 is equivalent to the thicker sidewall image portions 322 and 324 of FIG. 3B and 4B, and acts in a similar manner. The remaining sidewall image reversal, trench etch, and trench fill processing steps of FIGS. 5E-5H are equivalent to the previous processing steps of FIGS. 3C-3F. The resulting isolation arrangement is shown in FIG. 5H.

Note that the preferred processing steps 5A-5H produce an isolated well region with excellent alignment of the implanted well region 535 to the isolation trench structure. Furthermore, this approach avoids the stray lateral scattering problem, and provides an isolated well region having an optimum doping concentration across its entire width. This result was achieved by using first and second conformal layers to define first and second sidewall spacers 522, 524, and 526, 528, respectively. The area 520 between the first sidewall image 522 and 524 is used as an aperture with which to implant the well region. Thus, the laterally scattered dopants occur under the first sidewall image portions, and are subsequently removed during isolation trench etching. With respect to well doping concentration, the use of the area between the thinner first sidewall spacers 522 and 524 as a well aperture 520 also allows the formation of an implanted well region 535 which is wider than the implanted well region 435 of the embodiment of FIG. 4B. Thus, the lateral diffusion areas 539, which are of lower dopant concentration, are made to lie entirely under the first and second sidewall image portions and are thus subsequently removed during etching of the isolation trenches.

The processing methods of the present invention and many of their attendant advantages will be understood from the foregoing description, and it will be apparent that various changes can be made in the form, construction, and arrangement of the steps thereof without departing from the spirit and scope of the invention, the forms described above being merely exemplary or preferred embodiments of the invention whose scope is defined by the following claims.

What is claimed is:

1. A process for self-aligning an isolation structure to an implanted region, comprising the steps of:
   providing on a surface of a semiconductor substrate, a masking layer having at least one aperture formed therein, said aperture having sidewalls which are substantially perpendicular to the surface of said substrate;
   implanting dopant ions into said substrate through said masking layer, so as to form a dopant region in said substrate;
   defining sidewall spacers on said sidewalls of said aperture formed in said masking layer;
   performing a sidewall image reversal process so that said sidewall spacers define trench apertures in a masking structure formed on said substrate;
   etching isolation trenches into said substrate through said masking structure; and
   wherein said step of implanting dopant ions is carried out immediately after said step of forming sidewall spacers on said sidewalls of said aperture is performed.

2. A process for self-aligning an isolation structure to an implanted region, comprising the steps of:
   providing on a surface of semiconductor substrate, a masking layer having at least one aperture formed therein, said aperture having sidewalls which are substantially perpendicular to the surface of said substrate;
   defining first sidewall spacers on said sidewalls of said aperture formed in said masking layer;
   implanting dopant ions into a portion of said substrate exposed between said first sidewall spacers, so as to form a diffusion region in said substrate;
   defining second sidewall spacers on said first sidewall spacers;

performing a sidewall image reversal process so that said first and second sidewall spacers define trench apertures in a masking structure formed on said substrate; and etching isolation trenches into portions of said semiconductor substrate exposed by said masking structure.

3. A process as claimed in claim 2, wherein said first and second sidewall spacers are each defined by a process comprising the steps of:

depositing a conformal layer on all exposed surfaces of the substrate and said masking layer; and anisotropically etching to remove all areas of said conformal layer except portions thereof disposed on said sidewalls of said aperture formed in said masking layer.

4. A process as claimed in claim 3, wherein said conformal layer is composed of silicon nitride.

5. A process as claimed in claim 4 wherein the step of removing said sidewall spacers is performed by exposure to $H_3PO_4$.

6. A process as claimed in claim 2, wherein the said sidewall image reversal process comprises the steps of:

removing said masking layer; forming a second masking layer of a thickness sufficient to cover said sidewall spacers;

removing upper-most portions of said second masking layer to a point where said sidewall spacers are exposed; and removing said sidewall spacers while leaving the second masking layer substantially undisturbed.

7. A process as claimed in claim 6 wherein the step of removing said second masking layer is performed by using a planarizing process.

8. A process as claimed in claim 6 wherein the step of removing said second masking layer is performed by using a polishing process.

9. A process as claimed in claim 2, further comprising the step of:

placing isolation material in said isolation trenches.

10. A process for self-aligning an isolation structure to a diffusion region formed in a surface of a semiconductor substrate, comprising the steps of:

providing a masking layer on the substrate, said masking layer having at least one aperture formed therein having sidewalls which are substantially perpendicular to the surface of the substrate;

depositing a first conformal layer on all exposed surfaces, including said sidewalls of said aperture;

defining first sidewall spacers by anisotropically etching to remove all portions of said conformal layer except those portions disposed on said sidewalls of said aperture, said first sidewall spacers having side surfaces that are substantially perpendicular to the surface of the semiconductor substrate;

implanting dopant ions into a portion of the semiconductor substrate exposed by said first sidewall spacers, so as to form a diffusion region in the substrate;

depositing a second conformal layer on all exposed surfaces, including said side surfaces of said first sidewall spacers;

defining second sidewall spacers by anisotropically etching to remove all portions of said second conformal layer except for the portions disposed on said side surfaces of said first sidewall spacers;

removing said first masking layer; forming a second masking layer of a thickness sufficient to cover said first and second sidewall spacers;

planarizing said second masking layer to a point where said first and second sidewall spacers are exposed;

defining trench apertures in said second masking layer by removing said exposed sidewall spacers while leaving said second masking layer substantially undisturbed; and forming isolation trenches by etching the portions of said semiconductor substrate exposed through said second masking layer.

11. A process as claimed in claim 10 further comprising the step of:

providing isolation material in said isolation trenches.

* * * * *